(12) United States Patent
Yun et al.

(10) Patent No.: US 9,570,716 B2
(45) Date of Patent: Feb. 14, 2017

(54) DEPOSITION SUBSTRATE TRANSFERRING UNIT, ORGANIC LAYER DEPOSITION APPARATUS INCLUDING THE SAME, AND METHOD OF MANUFACTURING ORGANIC LIGHT-EMITTING DISPLAY DEVICE BY USING THE SAME

(71) Applicant: SAMSUNG DISPLAY CO., LTD., Yongin, Gyeonggi-Do (KR)

(72) Inventors: Ki-Young Yun, Yongin (KR); Jong-Hee Lim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 375 days.

(21) Appl. No.: 14/102,141

(22) Filed: Dec. 10, 2013

(65) Prior Publication Data
US 2014/0346467 A1  Nov. 27, 2014

(30) Foreign Application Priority Data

May 27, 2013  (KR) .......................... 10-2013-0059929

(51) Int. Cl.
| | | |
|---|---|---|
| *H01L 51/56* | (2006.01) | |
| *H01L 21/677* | (2006.01) | |
| *H01L 21/683* | (2006.01) | |

(52) U.S. Cl.
CPC ........... *H01L 51/56* (2013.01); *H01L 21/6776* (2013.01); *H01L 21/67748* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 2004/0047720 A1* | 3/2004 | Lerner | H01L 21/68 414/781 |
| 2007/0055403 A1* | 3/2007 | MacDonald | G05B 13/04 700/108 |
| 2007/0107656 A1* | 5/2007 | Shinozaki | H01L 21/67259 118/50 |
| 2007/0169703 A1* | 7/2007 | Elliot | C23C 16/4586 118/728 |
| 2008/0233283 A1 | 9/2008 | Choi et al. | |

(Continued)

FOREIGN PATENT DOCUMENTS

| | | |
|---|---|---|
| KR | 10-2008-0086261 | 9/2008 |
| KR | 10-2011-0112123 | 10/2011 |

OTHER PUBLICATIONS

US Publication No. 2008/0233283 (For KR-10-2008-0086261).
US Publication No. 20110244120 (For KR-10-2011-0112123).

*Primary Examiner* — Nathan T Leong
(74) *Attorney, Agent, or Firm* — F. Chau & Associates, LLC

(57) ABSTRACT

A deposition substrate transferring unit that can deposit a deposition material at an exact location on a substrate, includes an electrostatic chuck that has a first surface to which a substrate is attached; and a carrier having a surface that combines with a second surface of the electrostatic chuck to move the electrostatic chuck in a first direction. The carrier includes accommodation parts disposed in empty space within the carrier, and supplementary ribs respectively formed on surfaces of the accommodation parts.

15 Claims, 11 Drawing Sheets

(56) References Cited

U.S. PATENT DOCUMENTS

| | | | |
|---|---|---|---|
| 2011/0201139 A1* | 8/2011 | Ishida | H01L 21/67253 438/17 |
| 2011/0244120 A1* | 10/2011 | Choi | H01L 21/67173 427/162 |
| 2013/0341598 A1* | 12/2013 | Chang | C23C 14/12 257/40 |
| 2014/0346467 A1* | 11/2014 | Yun | H01L 51/56 257/40 |

* cited by examiner

DEPOSITION SUBSTRATE TRANSFERRING UNIT, ORGANIC LAYER DEPOSITION APPARATUS INCLUDING THE SAME, AND METHOD OF MANUFACTURING ORGANIC LIGHT-EMITTING DISPLAY DEVICE BY USING THE SAME

CROSS-REFERENCE TO RELATED PATENT APPLICATION

This application claims priority under 35 U.S.C. §119 from Korean Patent Application No. 10-2013-0059929, filed on May 27, 2013, in the Korean Intellectual Property Office, and all the benefits accruing therefrom, the contents of which are herein incorporated by reference in their entirety.

BACKGROUND

1. Technical Field

Embodiments of the present disclosure are directed to a deposition substrate transferring unit, an organic layer deposition apparatus including the same, and a method of manufacturing an organic light-emitting display device by using the same, and more particularly, to a deposition substrate transferring unit for depositing a deposition material at an exact location on a substrate, an organic layer deposition apparatus including the substrate transfer unit, and a method of manufacturing an organic light-emitting display device by using the substrate transfer unit.

2. Discussion of the Related Art

Organic light-emitting display devices have wider viewing angles, better contrast characteristics, and faster response speeds than other display devices, and thus have drawn attention as next-generation display devices.

An organic light-emitting display device includes intermediate layers, including an emission layer, disposed between a first electrode and a second electrode. The electrodes and the intermediate layers may be formed using various methods, one of which is an independent deposition method. When an organic light-emitting display device is manufactured using this deposition method, a fine metal mask (FMM) that has the same pattern as that of an organic layer to be formed is disposed in close contact with a substrate on which the organic layer is formed, and an organic layer material is deposited on the FMM to form the organic layer having the desired pattern.

However, a deposition method using such an FMM presents challenges for manufacturing larger organic light-emitting display devices. For example, when such a large mask is used, the mask may bend due to self-gravity, thereby distorting a pattern, which is not conducive to the fabrication of a high-definition pattern.

SUMMARY

Embodiments of the present disclosure provide a deposition substrate transferring unit for depositing a deposition material at an exact location on a substrate, an organic layer deposition apparatus including the substrate transfer unit, and a method of manufacturing an organic light-emitting display device by using the substrate transfer unit.

According to an aspect of the present disclosure, there is provided a deposition substrate transferring unit that includes an electrostatic chuck having a first surface to attach to a substrate; and a carrier having a surface that combines with a second surface of the electrostatic chuck to move the electrostatic chuck in a first direction, the carrier further comprising accommodation parts disposed in empty space therein, and supplementary ribs respectively disposed on surfaces of the accommodation parts.

The supplementary ribs may be disposed on inner sides of the surface of the carrier.

Each of the supplementary ribs may have an X-shape.

The carrier may further include grinding-target parts disposed to project from the surface combined with the electrostatic chuck, and may be grinded to a predetermined level.

The carrier may include at least one of a carrier temperature sensor for measuring a temperature of the carrier to check thermal deformation of the carrier; an electrostatic chuck temperature sensor for measuring a temperature of the electrostatic chuck to check thermal deformation of the electrostatic chuck; a substrate detection sensor for detecting whether the substrate is attached to the electrostatic chuck; a power measurement unit for measuring current consumption of the deposition substrate transferring unit or a remaining power of a battery; and an electrostatic chuck driving detection unit for detecting an ON or OFF state of the electrostatic chuck.

The deposition substrate transferring unit may further include a communication unit for transmitting information measured by the carrier temperature sensor, the electrostatic chuck temperature sensor, the substrate detection sensor, the power measurement unit, or the electrostatic chuck driving detection unit.

The electrostatic chuck may be integrally formed in one body.

The electrostatic chuck may have lift pin holes disposed in a region that corresponds to an outer region of a pixel region of the substrate.

The electrostatic chuck may have an alignment mark disposed thereon to align the electrostatic chuck and the substrate.

According to another aspect of the present disclosure, there is provided an organic layer deposition apparatus including a deposition substrate transferring unit including an electrostatic chuck having a first surface to which a substrate is attached, and a carrier having a surface that is combined with a second surface of the electrostatic chuck to move the electrostatic chuck in a first and a second direction; a conveyer unit including a first conveyer unit for moving the deposition substrate transferring unit on which the substrate is fixed in the first direction, and a second conveyer unit for moving the deposition substrate transferring unit in the second direction opposite the first direction, wherein the deposition substrate transferring unit is configured to be transferred from the first conveyer unit to the second conveyer unit; and a deposition unit including a chamber and an organic layer deposition assembly that is spaced apart from the substrate by a predetermined distance that deposits a material on the substrate while the first conveyer unit moves the substrate attached to the deposition substrate transferring unit.

The deposition substrate transferring unit may include at least one of a carrier temperature sensor for measuring a temperature of the carrier to check thermal deformation of the carrier; an electrostatic chuck temperature sensor for measuring a temperature of the electrostatic chuck to check thermal deformation of the electrostatic chuck; a substrate detection sensor for detecting whether the substrate is attached to the electrostatic chuck; a power measurement unit for measuring current consumption of the deposition substrate transferring unit or a remaining power of a battery;

and an electrostatic chuck driving detection unit for detecting an ON or OFF state of the electrostatic chuck.

The organic layer deposition apparatus may further include a communication unit for transmitting information that is measured by the carrier temperature sensor, the electrostatic chuck temperature sensor, the substrate detection sensor, the power measurement unit, or the electrostatic chuck driving detection unit. The communication unit may be a short-distance wireless communication unit.

The electrostatic chuck may be integrally formed in one body.

The carrier may further comprise a magnetic rail placed on a surface thereof, each of the first conveyer unit and the second conveyer unit may include a plurality of coils, wherein the magnetic rail and the plurality of coils may be combined to constitute a linear motor for generating a driving force to move the deposition substrate transferring unit.

The first conveyer unit may include accommodation grooves disposes on both sides of the deposition substrate transferring unit to guide the deposition substrate transferring unit to move in the first direction; and magnetically suspended bearings configured to suspend the deposition substrate transferring unit from the accommodation grooves to move the deposition substrate transferring unit without contacting the accommodation grooves.

The magnetically suspended bearings may include side magnetically suspended bearings disposed on both side surfaces of the carrier and upper magnetically suspended bearings disposed above the carrier.

The carrier may further comprise a plurality of cam followers disposed on both side surfaces of the carrier, and the second conveyer unit may include a roller guide to support the cam followers, wherein the cam followers move the carrier along the roller guide.

The carrier may include a contactless power supply (CPS) module, and the second conveyer unit may include a charging track disposed in a portion thereof which corresponds to the CPS module, wherein when the carrier is transferred into the second conveyer unit, a magnetic field may form between the charging track and the CPS module that supplies power to the CPS module, wherein the CPS module does not contact the charging track.

According to another aspect of the present disclosure, there is provided a method of manufacturing an organic light-emitting display device, the method including operations of conveying a deposition substrate transferring unit having a substrate fixed thereto in a first direction into a chamber using a first conveyer unit configured to pass through the chamber; discharging a deposition material discharged from an organic layer deposition assembly to form a layer on the substrate while the first conveyer unit moves the substrate relative to the organic layer deposition assembly; separating the substrate from the deposition substrate transferring unit; and conveying the deposition substrate transferring unit in a second direction opposite to the first direction using a second conveyer unit that is configured to pass through the chamber, wherein the deposition substrate transferring unit comprises a carrier having a magnetic rail placed on a surface thereof, each of the first conveyer unit and the second conveyer unit comprises a plurality of coils, wherein the magnetic rail and the plurality of coils combine to form a linear motor that generates a driving force to move the deposition substrate transferring unit.

The first conveyer unit may include accommodation grooves disposed on both sides of the deposition substrate transferring unit which are configured to guide the deposition substrate transferring unit to move in the first direction; and a plurality of magnetically suspended bearings that are configured to suspend the deposition substrate transferring unit from the accommodation grooves, wherein the deposition substrate transferring unit moves along the first conveyer unit without contacting the accommodation grooves.

The magnetically suspended bearings may include side magnetically suspended bearings disposed on both side surfaces of the carrier and upper magnetically suspended bearings disposed above the carrier.

The carrier may further include a plurality of cam followers disposed on both side surfaces thereof, and the second conveyer unit may further include a roller guide configured to support the plurality of cam followers. The cam followers may move the carrier along the roller guide.

The carrier may further include a contactless power supply (CPS) module, and the second conveyer unit may further include a charging track disposed in a portion thereof which corresponds to the CPS module. When the carrier is transferred into the second conveyer unit, a magnetic field may form between the charging track and the CPS module that supplies power to the CPS module, where the CPS module does not contact the charging track.

The method may further include measuring information about at least one of checking thermal deformation of the carrier, checking thermal deformation of the electrostatic chuck, detecting whether the substrate is attached to the electrostatic chuck, measuring current consumption of the deposition substrate transferring unit or a remaining power of a battery, and detecting an ON or OFF state of the electrostatic chuck.

The information may be transmitted to a control unit of the organic layer deposition assembly via short-distance wireless communication.

According to another aspect of the present disclosure, there is provided an organic light-emitting display device including a substrate; thin film transistors on the substrate; pixel electrodes that are electrically connected to the thin film transistors; deposition layers disposed on the pixel electrodes; and an opposite electrode disposed on the deposition layers, wherein at least one of the deposition layers is linearly patterned using the method of manufacturing an organic light-emitting display device.

DETAILED DESCRIPTION OF EXEMPLARY

Figure 1:
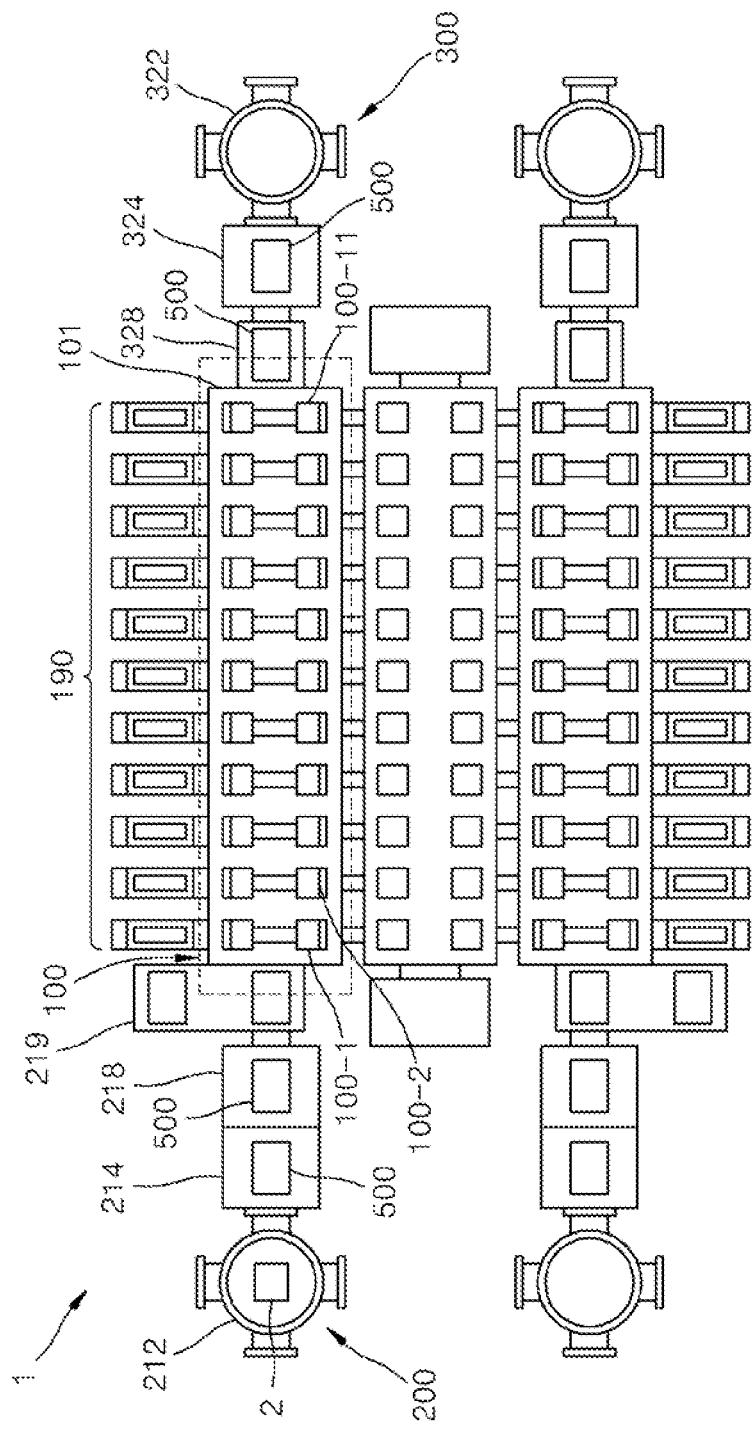
FIG. 1 is a schematic plan view illustrating a structure of an organic layer deposition apparatus according to an embodiment of the present disclosure.

Hereinafter, exemplary embodiments of the present disclosure will be described in detail with reference to the attached drawings. Embodiments of the disclosure may, however, be embodied in many different forms and should not be construed as being limited to the exemplary embodiments set forth herein. Thus, exemplary embodiments of the disclosure should be considered in a descriptive sense only and not for purposes of limitation. Therefore, the scope of the disclosure is defined not by the detailed description of the disclosure but by the appended claims, and all differences within the scope will be construed as being included in the present disclosure. Like reference numerals in the drawings denote like or similar elements throughout the specification.

Figure 2:
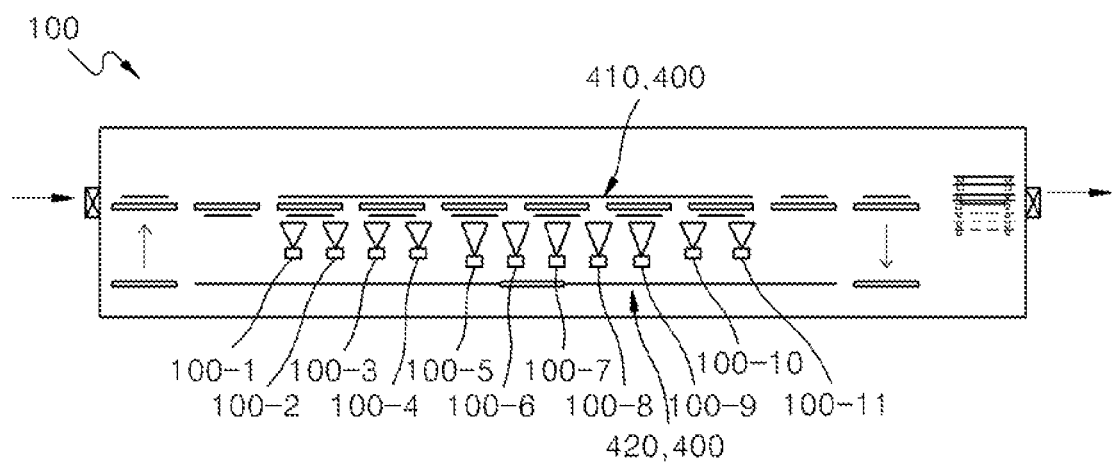
FIG. 2 is a schematic side view of a deposition unit of the organic layer deposition apparatus of FIG. 1, according to an embodiment of the present disclosure.

FIG. 1 is a schematic plan view illustrating a structure of an organic layer deposition apparatus 1 according to an embodiment of the present disclosure. FIG. 2 is a schematic side view of a deposition unit 100 of the organic layer deposition apparatus 1 of FIG. 1, according to an embodiment of the present disclosure.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material will be applied are stacked on the first rack 212. A transport robot included in the transport chamber 214 picks up one of the substrates 2 from the first rack 212, disposes it on a deposition substrate transferring unit 500 received from a second conveyer unit 420, and moves the deposition substrate transferring unit 500 on which the substrate 2 is disposed into the first inversion chamber 218.

The first inversion chamber 218 is disposed adjacent to the transport chamber 214. The first inversion chamber 218 includes a first inversion robot that inverts the deposition substrate transferring unit 500 and then loads it on a first conveyer unit 410 of the deposition unit 100.

Referring to FIG. 1, the transport robot of the transport chamber 214 places one of the substrates 2 on a top surface of the deposition substrate transferring unit 500, and the deposition substrate transferring unit 500 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the deposition substrate transferring unit 500, which has passed through the deposition unit 100 while having the substrate 2 disposed thereon, and then moves the inverted deposition substrate transferring unit 500 and substrate 2 into an ejection chamber 324. Then, an ejection robot removes the deposition substrate transferring unit 500 from the ejection chamber 324, separates the substrate 2 from the deposition substrate transferring unit 500, and then loads the substrate 2 on a second rack 322. The deposition substrate transferring unit 500, now separated from the substrate 2, is returned to the loading unit 200 via the second conveyer unit 420.

However, embodiments of the present disclosure are not limited to the above example. For example, when disposing the substrate 2 on the deposition substrate transferring unit 500, the substrate 2 may be fixed onto a bottom surface of the deposition substrate transferring unit 500 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In an embodiment, as illustrated in FIGS. 1 and 2, the deposition unit 100 includes a chamber 101 in which a plurality of organic layer deposition assemblies (100-1), (100-2), . . . , (100-11) may be disposed. Referring to FIG. 1, 11 organic layer deposition assemblies, i.e., a first organic layer deposition assembly (100-1), a second organic layer deposition assembly (100-2), . . . , and an eleventh organic layer deposition assembly (100-11), are shown as being disposed in the chamber 101, but this number of organic layer deposition assemblies is exemplary and non-limiting and may vary according to a desired deposition material and deposition conditions. The chamber 101 is maintained in a vacuum during the deposition process.

In an embodiment illustrated in FIG. 1, the deposition substrate transferring unit 500 with the substrate 2 fixed thereon may be moved by the first conveyer unit 410 at least to the deposition unit 100 or may be moved sequentially to the loading unit 200, the deposition unit 100, and the unloading unit 300, which separates the substrate 2 from the deposition substrate transferring unit 500, and the separated deposition substrate transferring unit 500 may be moved back to the loading unit 200 by the second conveyer unit 420.

The first conveyer unit 410 passes through the chamber 101 when passing through the deposition unit 100, and the second conveyer unit 420 conveys the deposition substrate transferring unit 500 from which the substrate 2 is separated.

In a present embodiment, the organic layer deposition apparatus 1 is configured such that the first conveyer unit 410 is vertically spaced above the second conveyer unit 420 so that after deposition has been completed, the deposition substrate transferring unit 500 is separated from the substrate 2 in the unloading unit 300 and returned to the loading unit 200 via the second conveyer unit 420, which is spaced below the first conveyer unit 410, whereby the organic layer deposition apparatus 1 may have an improved space utilization efficiency.

In an embodiment, the deposition unit 100 of FIG. 1 may further include a deposition source replacement unit 190 disposed at a side of each organic layer deposition assembly. The deposition source replacement unit 190 may a cassette that is externally disposed with respect to each organic layer deposition assembly. Thus, a deposition source 110 (see FIG. 3) for each organic layer deposition assembly 100-1, . . . , may be easily replaced.

FIG. 1 shows the organic layer deposition apparatus 1 as having two sets of parallel structures, each including the loading unit 200, the deposition unit 100, the unloading unit 300, and the conveyer unit 400. That is, it can be seen that two organic layer deposition apparatuses 1 are respectively arranged along side of each other in FIG. 1.

Figure 3:
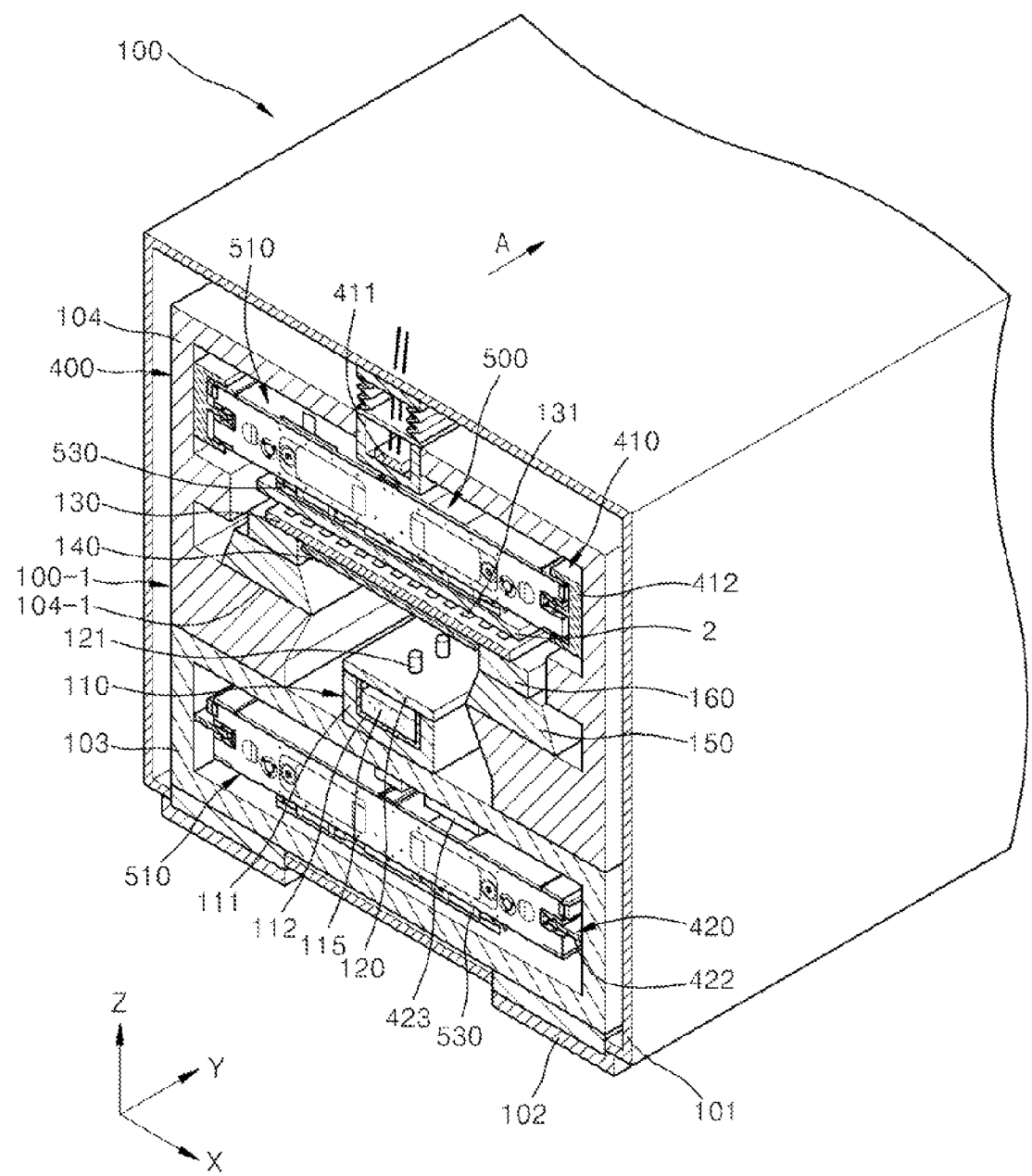
FIG. 3 is a schematic perspective view of the deposition unit of the organic layer deposition apparatus of FIG. 1, according to an embodiment of the present disclosure.
Figure 4:
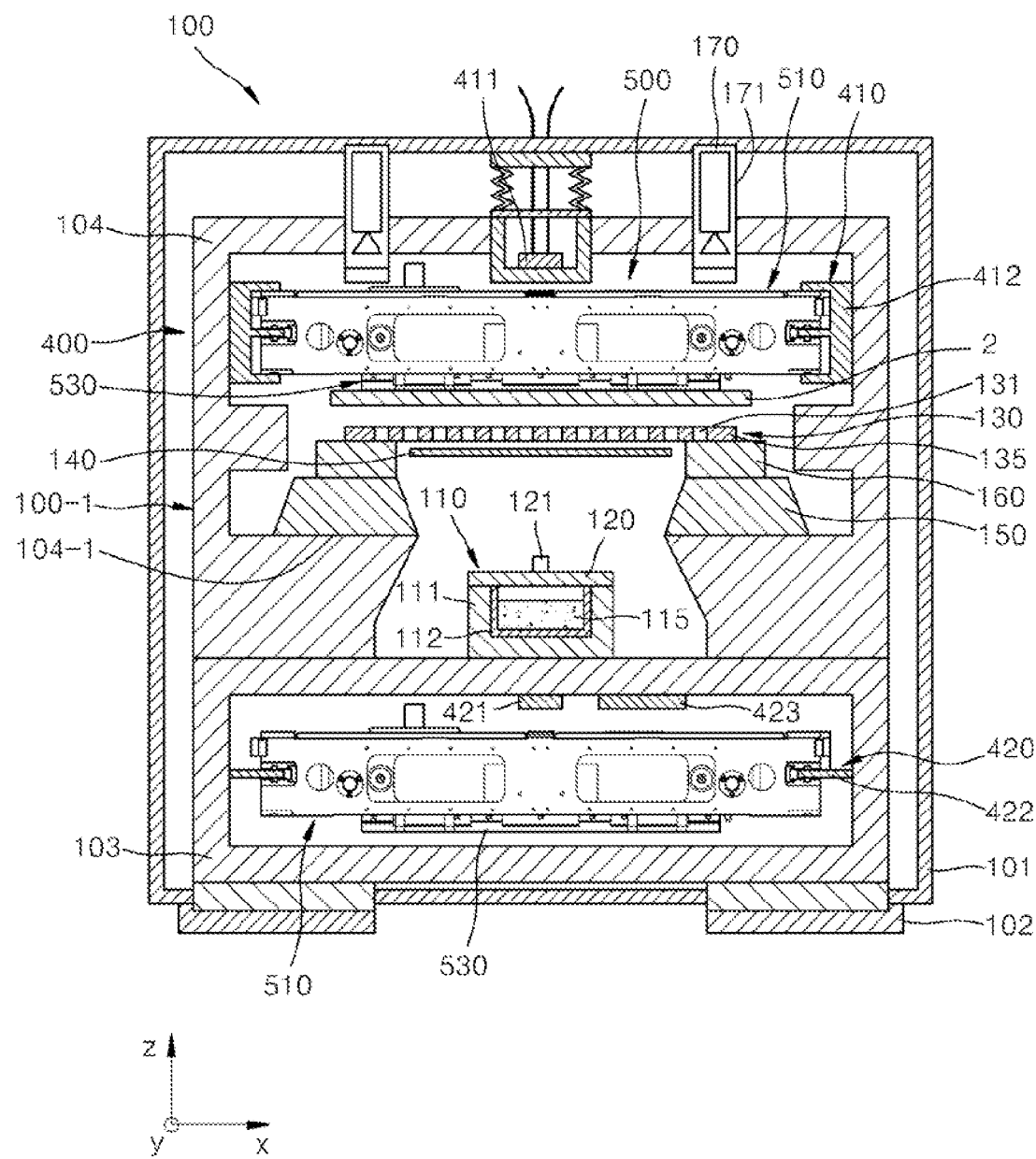
FIG. 4 is a schematic cross-sectional view of the deposition unit of FIG. 3, according to an embodiment of the present disclosure.
Figure 5:
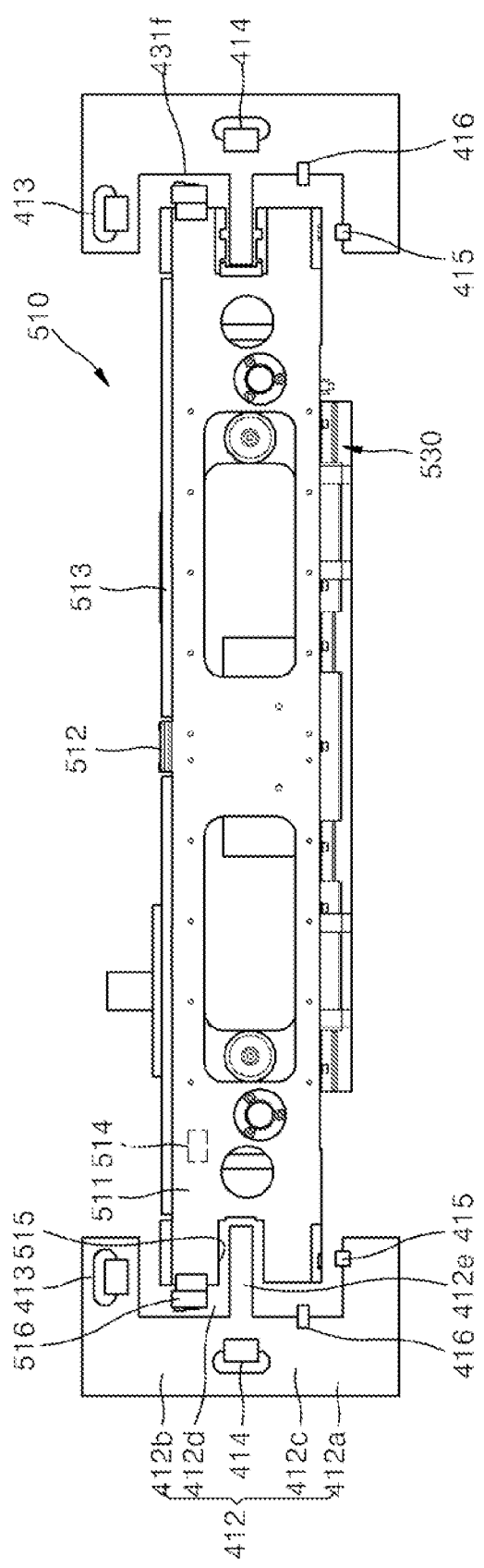
FIG. 5 is a cross-sectional view particularly illustrating a first conveyer unit and a deposition substrate transferring unit of the deposition unit shown in FIG. 3.
Figure 6:
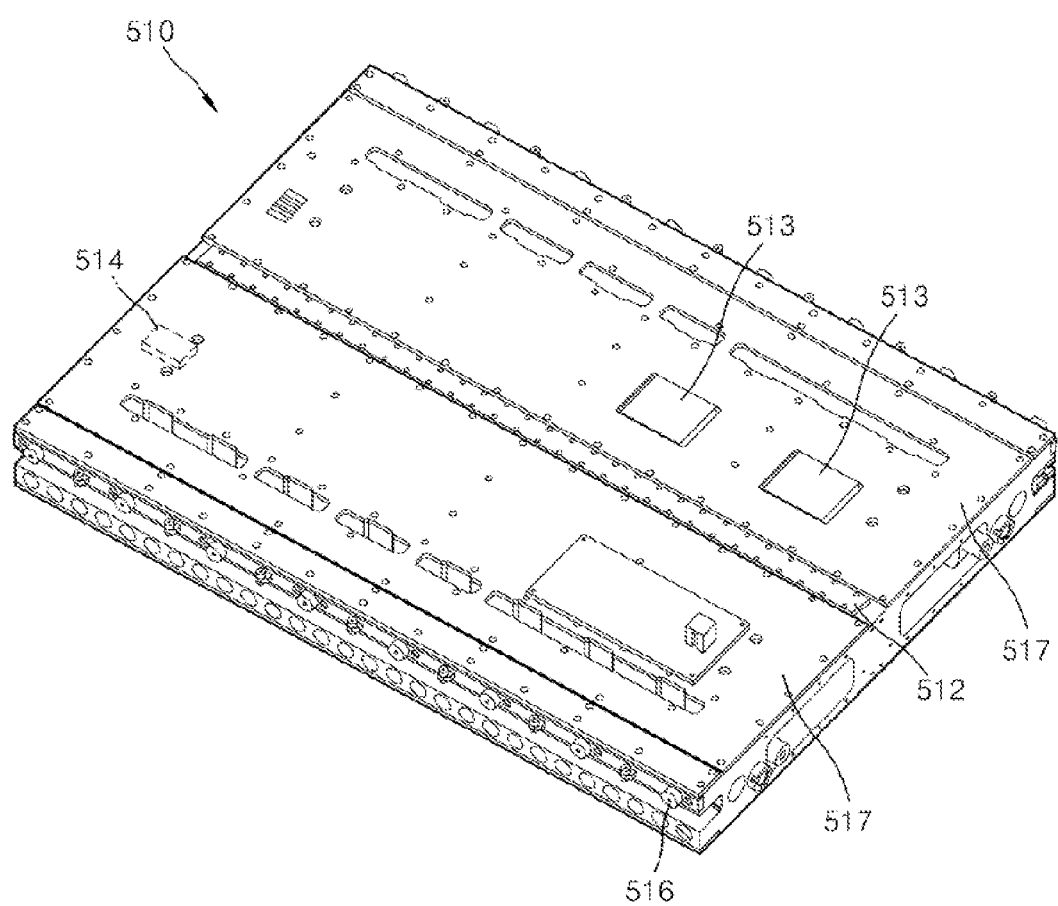
FIG. 6 is a top perspective view of a carrier of the deposition substrate transferring unit of the deposition unit shown in FIG. 3.
Figure 7:
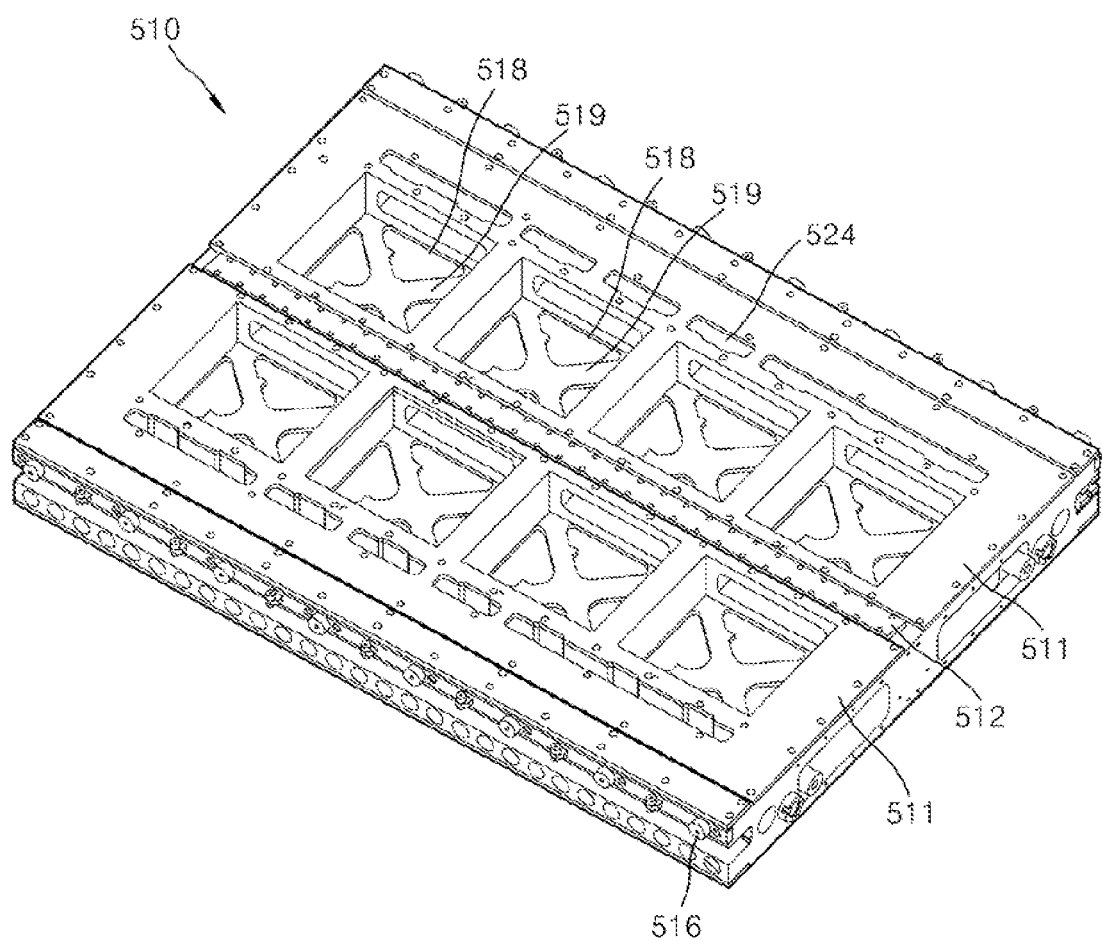
FIG. 7 is a perspective view of the carrier of FIG. 6 without a top plate.
Figure 8:
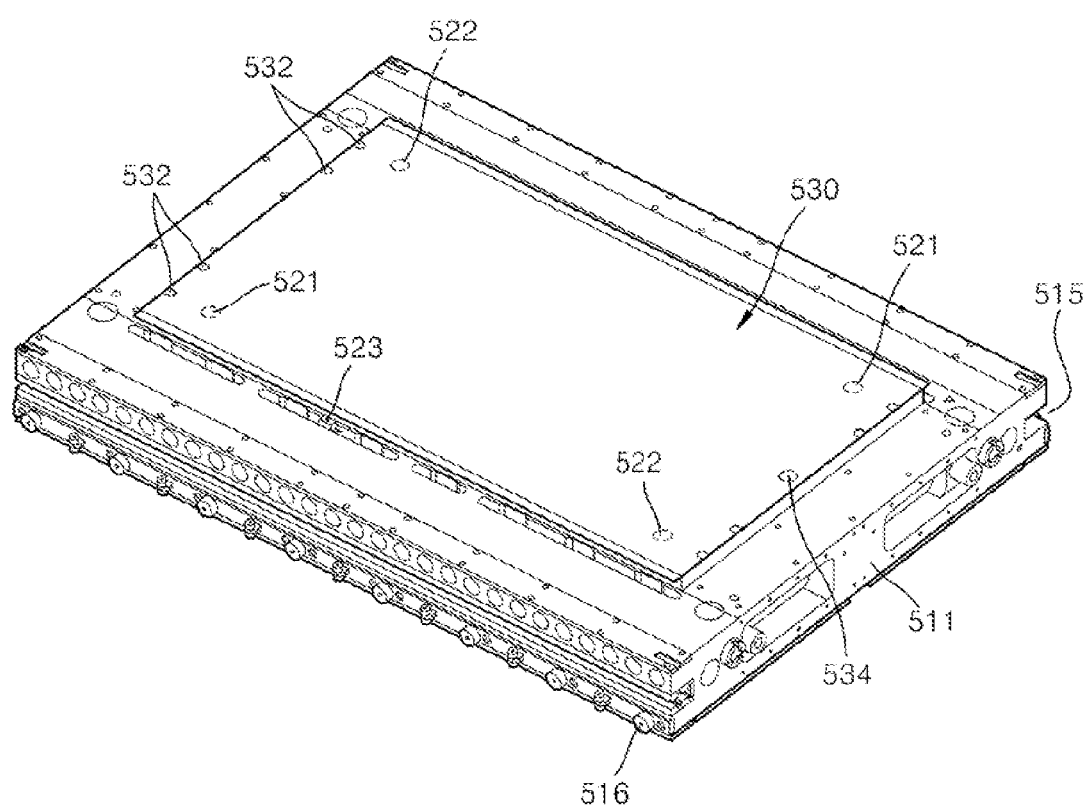
FIG. 8 is a bottom perspective view of the carrier of the deposition substrate transferring unit of the deposition unit shown in FIG. 3.
Figure 9:
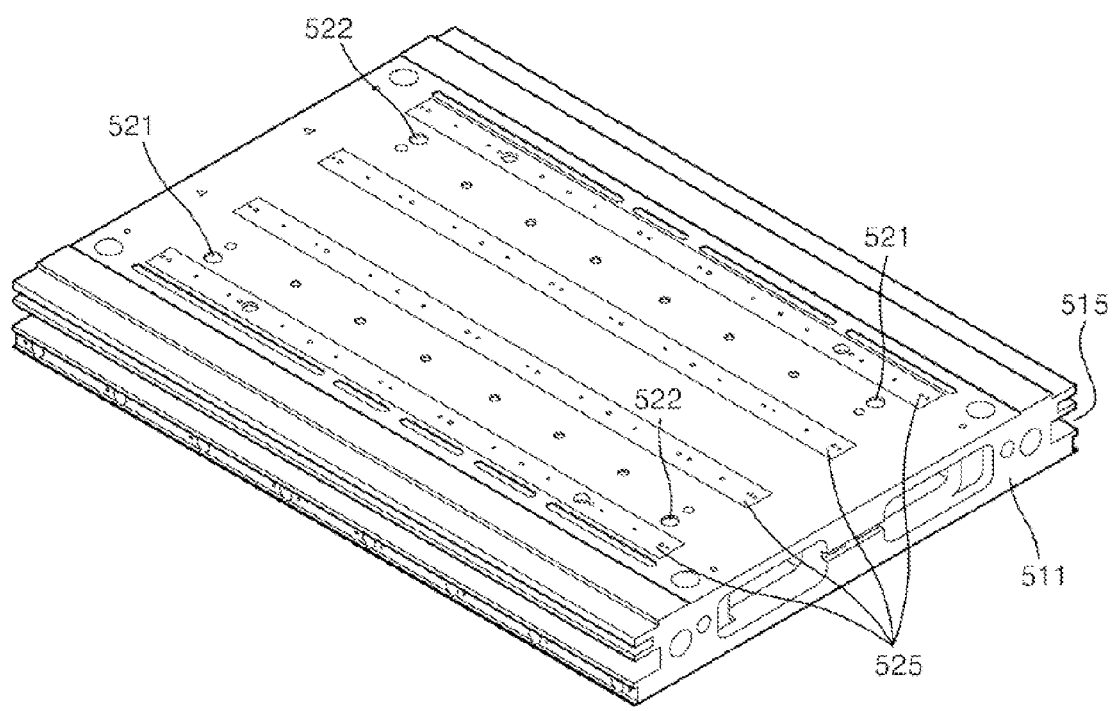
FIG. 9 is a perspective view illustrating the carrier of FIG. 8 without an electro static chuck.

FIG. 3 is a schematic perspective view of the deposition unit 100 of the organic layer deposition apparatus 1 of FIG. 1, according to an embodiment of the present disclosure. FIG. 4 is a schematic cross-sectional view of the deposition unit 100 of FIG. 3, according to an embodiment of the present disclosure. FIG. 5 is a cross-sectional view particularly illustrating a first conveyer unit 410 and the deposition substrate transferring unit 500 of the deposition unit 100 shown in FIG. 3. FIG. 6 is a top perspective view of a carrier 510 of the deposition substrate transferring unit 500 of the deposition unit 100 shown in FIG. 3. FIG. 7 is a perspective view of the carrier 510 of FIG. 6 without a top plate 517. FIG. 8 is a bottom perspective view of the carrier 510 of the deposition substrate transferring unit 500 of the deposition unit 100 shown in FIG. 3. FIG. 9 is a perspective view of the carrier 510 of FIG. 8 without an electro static chuck.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be a hollow box that accommodates the at least one organic layer deposition assembly 100-1 and the deposition substrate transferring unit 500. The chamber 101 includes a foot 102 than can fix the deposition unit 100 on the ground, a lower housing 103 disposed on the foot 102, and an upper housing 104 disposed on the lower housing 103. The chamber 101 accommodates both the lower housing 103 and the upper housing 104. In this regard, a connection between the lower housing 103 and the chamber 101 is sealed to completely isolate the inside of the chamber 101 from the outside. Since the lower housing 103 and the upper housing 104 are disposed on the foot 102 fixed on the ground, the lower housing 103 and the upper housing 104 may remain in a fixed position even as the chamber 101 repeatedly contracts and expands. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. A deposition process is continuously performed while the deposition substrate transferring unit 500 is being transferred by the first conveyer unit 410 to the second conveyer unit 420.

Hereinafter, constituents of the organic layer deposition assembly 100-1 are described in detail.

The first organic layer deposition assembly 100-1 includes the deposition source 110, a deposition source nozzle unit 120, a patterning slit sheet 130, a shielding member 140, a first stage 150, and a second stage 160. The elements illustrated in FIGS. 3 and 4 may be arranged in the chamber 101 maintained in an appropriate vacuum state. This structure is needed to deposit a deposition material 115 in a straight line.

In particular, to deposit a deposition material 115 discharged from the deposition source 110 through the deposition source nozzle unit 120 and the patterning slit sheet 130 onto the substrate 2 in a desired pattern, it is desirable to maintain the chamber in the same vacuum state as that used in a deposition method of a fine metal mask (FMM). In addition, the temperature of the patterning slit sheet 130 should be sufficiently lower than that of the deposition source 110 to minimize thermal expansion of the patterning slit sheet 130.

The substrate 2 on which the deposition material 115 is to be deposited may be a substrate for a flat panel display device. For example, a large substrate that is greater than equal to 40 inches, such as a mother glass for manufacturing a plurality of flat panel displays, may be used as the substrate 2.

According to an embodiment, the deposition process may be performed with the substrate 2 moving relative to the organic layer deposition assembly 100-1.

In a conventional deposition method using an FMM, the size of the FMM needs to be the same as that of a substrate. Thus, as the size of the substrate increases, the FMM size also needs to increase. It is challenging to fabricate an FMM and to precisely align the FMM by elongation.

In the organic layer deposition assembly 100-1 according to a present embodiment, deposition may be performed while the organic layer deposition assembly 100-1 and the substrate 2 are moving relative to each other. In other words, deposition may be continuously performed while the substrate 2, which faces the organic layer deposition assembly 100-1, is moved in a Y-axis direction. That is, deposition is performed by scanning while the substrate 2 moves in a direction of the arrow A illustrated in FIG. 3. Although the substrate 2 is illustrated as moving in the Y-axis direction in the chamber 101 in FIG. 3 when deposition is performed, the present disclosure is not limited thereto. For example, deposition may be performed while the organic layer deposition assembly 100-1 is moving in the Y-axis direction and the substrate 2 is held fixed.

Thus, in the organic layer deposition assembly 100-1, the patterning slit sheet 130 may be smaller than an FMM used in a conventional deposition method. In other words, in the organic layer deposition assembly 100-1, deposition is continuously performed by scanning while the substrate 2 is moving in the Y-axis direction. Thus, at least one side of the patterning slit sheet 130 in X-axis and Y-axis directions may be shorter than a length of the substrate 2. Since the patterning slit sheet 130 may be smaller than the FMM used in a conventional deposition method, the patterning slit sheet 130 may be more easily manufactured.

To perform deposition while the organic layer deposition assembly 100-1 moves relative to the substrate 2 as described above, the organic layer deposition assembly 100-1 may be spaced apart from the substrate 2 by a certain distance. This is described below in more detail.

The deposition source 110 that contains and heats the deposition material 115 is disposed in the chamber to face the substrate 2. As the deposition material 115 contained in the deposition source 110 vaporizes, deposition is performed on the substrate 2.

In more detail, the deposition source 110 includes a crucible 111 that is filled with the deposition material 115 and a heater 112 that heats the crucible 111 so as to vaporize the deposition material 115 toward a side of the crucible 111 so that the vaporized deposition material flows toward the deposition source nozzle unit 120.

The deposition source nozzle unit 120 is disposed at a side of the deposition source 110 facing the substrate 2. The deposition source nozzle unit 120 includes a plurality of deposition source nozzles 121 at a central portion thereof. The vaporized deposition material 115 is discharged through the deposition source nozzles 121 to be deposited onto the substrate 2. According to embodiments, each organic layer deposition assembly may include different deposition nozzles for depositing common layers and pattern layers.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The vaporized deposition material 115 that has been discharged through the deposition source nozzle unit 120 and the patterning slit sheet 130 is then deposited onto the substrate 2. According to embodiments, the patterning slit sheet 130 may be formed using the same method as that used to form an FMM, such as etching. According to embodiments, a total number of patterning slits 131 may be greater than a total number of deposition source nozzles 121.

In an embodiment, the combined deposition source 110 and deposition source nozzle unit 120 and the patterning slit sheet 130 may be spaced apart from each other by a certain distance.

As described above, deposition is performed while the organic layer deposition assembly 100-1 moves relative to the substrate 2. To move the organic layer deposition assembly 100-1 relative to the substrate 2, the patterning slit sheet 130 is spaced apart from the substrate 2 by a certain distance.

In a conventional deposition method using an FMM, deposition is performed with the FMM in close contact with a substrate to prevent formation of shadows on the substrate. However, when the FMM is in close contact with the substrate, defects due to the contact between the substrate and the FMM may occur. In addition, since the mask may not move with respect to the substrate, the mask and the substrate need to be the same size. Accordingly, the mask needs to be as large as the size of a display device. However, it is challenging to form a large mask.

To address these issues, in the organic layer deposition assembly 100-1 according to a present embodiment, the patterning slit sheet 130 is spaced apart by a certain distance from the substrate 2 on which a deposition material is to be deposited.

According to a present embodiment, deposition may be performed while a mask that is smaller than a substrate moves with respect to the substrate. Thus, it may be easier to manufacture the mask. In addition, defects due to contact between the substrate and the mask may be prevented. In addition, since it is unnecessary for the substrate to closely contact the mask during a deposition process, a manufacturing speed may be improved.

Hereinafter, each element of the upper housing 104 will be described.

The deposition source 110 and the deposition source nozzle unit 120 are disposed on a bottom portion of the upper housing 104. Accommodation portions 104-1 respectively protrude from both sides of the deposition source 100 toward the deposition source nozzle unit 120. The first stage 150, the second stage 160, and the patterning slit sheet 130 are sequentially formed on the accommodation portions 104-1.

According to embodiments, the first stage 150 may move in the X-axis and Y-axis directions to align the patterning slit sheet 130 in the X-axis and Y-axis directions. That is, the first stage 150 includes a plurality of actuators that can move the first stage 150 with respect to the upper housing 104 in the X-axis and Y-axis directions.

The second stage 160 may move in a Z-axis direction to align the patterning slit sheet 130 in the Z-axis direction. That is, the second stage 160 includes a plurality of actuators that can move with respect to the first stage 150 in the Z-axis direction.

The patterning slit sheet 130 is disposed on the second stage 160 and the first stage 150 to move in the X-axis, Y-axis, and Z-axis directions, so that the substrate 2 may be aligned with the patterning slit sheet 130.

In addition, the upper housing 104, the first stage 150, and the second stage 160 may prevent the deposition material 115 being discharged through the deposition source nozzles 121 from being dispersed. That is, a path of the deposited deposition material 115 is determined by the upper housing 104, the first stage 150, and the second stage 160, which thus simultaneously guide the deposition of the deposition material 115 in the X-axis and Y-axis directions.

The shielding member 140 may be disposed between the patterning slit sheet 130 and the deposition source 110. In particular, an anode or cathode pattern may be disposed on an edge portion of the substrate 2 and used as a terminal for inspecting a product or in manufacturing a product. If an organic material is applied on a region of the substrate 2, the functioning of the anode or cathode may be compromised. Thus, the edge portion of the substrate 2 may be a non-film-forming region on which an organic material is not applied. As described above, however, in the organic layer deposition apparatus, deposition is performed by scanning while the substrate 2 moves relative to the organic layer deposition apparatus, and it is thus challenging to prevent organic material from being deposited on the non-film-forming region of the substrate 2.

Therefore, to prevent organic material from being deposited on the non-film-forming region of the substrate 2, in an organic layer deposition apparatus, the shielding member 140 may be further disposed on the edge portion of the substrate 2. In addition, the shielding member 140 may include two adjacent plates that are vertically disposed with respect to a movement direction of the substrate 2.

When there is no substrate 2 in the organic layer deposition assembly 100-1, the shielding member 140 screens the deposition source 110, and thus, deposition material 115 discharged from the deposition source 110 does not reach the patterning slit sheet 130. When the substrate 2 enters into the organic layer deposition assembly 100, a front part of the shielding member 140 moves along with the substrate 2, opening the flow path of the deposition material 115 so that deposition material 115 discharged from the deposition source 110 passes through the patterning slit sheet 130 to be deposited on the substrate 2. In addition, while the substrate 2 is passing through the organic layer deposition assembly 100-1, a rear part of the shielding member 140 moves along with the substrate 2 to screen the deposition source 110 and close the flow path of the deposition material 115. Accordingly, deposition material 115 discharged from the deposition source 110 does not reach the patterning slit sheet 130.

As described above, the non-film-forming region of the substrate 2 is screened by the shielding member 140, and thus a separate structure may not be needed to prevent organic material from being deposited on the non-film-forming region of the substrate 2.

The organic layer deposition assembly 100-1 of the organic layer deposition apparatus 1 according to a present embodiment may further include an alignment camera 170. In more detail, the camera 170 may be used to align in real time a first alignment mark in the patterning slit sheet 130 and a second alignment mark on the substrate 2. In this regard, the camera 170 is disposed to more accurately view the inside of the vacuum chamber 101 during deposition. For this, the camera 170 may be installed in a camera accommodation unit 171 in an atmospheric state.

Hereinafter, the conveyer unit 400 that conveys the substrate 2, on which the deposition material 115 is to be deposited, is described in more detail. Referring to FIGS. 3 through 9, the conveyer unit 400 includes the first conveyer unit 410, the second conveyer unit 420, and the deposition substrate transferring unit 500.

The first conveyer unit 410 linearly conveys the deposition substrate transferring unit 500, which includes the carrier 510 and an electrostatic chuck 530 attached thereto, and the substrate 2 attached to the deposition substrate transferring unit 500 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

After one deposition cycle is completed, the substrate 2 is separated from the deposition substrate transferring unit 500 in the unloading unit 300, and the second conveyer unit 420 returns the deposition substrate transferring unit 500 to the loading unit. The second conveyer unit 420 includes a coil 421, roller guides 422, and a charging track 423.

The deposition substrate transferring unit 500 includes the carrier 510 and the electrostatic chuck 530 that is on a surface of the carrier 510 and to which the substrate 2 is attached.

The carrier 510 of the deposition substrate transferring unit 500 will now be described in detail.

The carrier 510 includes a main body part 511, a magnetic rail 512, contactless power supply (CPS) modules 513, a power supply unit 514, and guide grooves 515. The carrier 510 may further include cam followers 516.

The main body part 511 constitutes a base part of the carrier 510 and may be formed of a magnetic material such as iron. According to embodiments, due to a magnetic force between the main body part 511 and the respective upper and side magnetically suspended bearings 413 and 414, which are described below, the carrier 510 may be maintained spaced apart from the guide members 412 by a certain distance.

The guide grooves 515 may be respectively disposed at both sides of the main body part 511 and each may accommodate a guide protrusion 412e of the guide member 412.

The magnetic rail 512 may be disposed along a center line of the main body part 511 in a moving direction of the main body part 511. The magnetic rail 512 of the main body part 511 and the coil 411 to be described below combine with each other to constitute a linear motor, and the carrier 510 may be conveyed in an arrow direction A by the linear motor.

The CPS modules 513 and the power supply unit 514 may be respectively disposed on both sides of the magnetic rail 512 in the main body part 511. The power supply unit 514 includes a battery, such as a rechargeable battery, that provides power so that the electrostatic chuck 530 can chuck the substrate 2 and maintain operation. The CPS modules 513 are wireless charging modules that charge the power supply unit 514. In particular, the charging track 423 disposed in the second conveyer unit 420, described below, is connected to an inverter, and thus, when the carrier 510 is transferred into the second conveyer unit 420, a magnetic field forms between the charging track 423 and the CPS modules 513 to supply power to the CPS module 513. The power supplied to the CPS modules 513 is used to charge the power supply unit 514.

A plurality of accommodation parts 518 that accommodate various parts that drive the carrier 510 may be disposed in the main body part 511, and may be covered by the top plate 517. Referring to FIG. 7, the main body part 511 may be divided into 8 areas in which eight accommodation parts 518 are disposed therein, but embodiments of the present disclosure are not limited thereto. Thus, according to embodiments, the number and disposition of the accommodation parts 518 may vary according to a structure of the carrier 510.

A supplementary rib 519 may be disposed at a bottom surface of each of the accommodation parts 518, i.e., on an inner side of a surface that is combined with the electrostatic chuck 530, to prevent sagging of the main body part 511 due to its weight. That is, as described above, to decrease a weight of the main body part 511, the main body part 511 has an empty space therein and the accommodation parts 518 are disposed in the empty space. However, by doing so, a rigidity of the main body part 511 deteriorates, and thus, the main body part 511 may sag due to its weight. Thus, the supplementary rib 519 is further disposed at the bottom surface of each of the accommodation parts 518, i.e., the inner side of the surface that is combined with the electrostatic chuck 530, to prevent sagging of the main body part 511 due to its weight. The supplementary rib 519 may have an X-shape to further increase the rigidity that prevents the main body part 511 from sagging.

A plurality of camera holes 524 may be further disposed in the main body part 511. The camera holes 524 may be disposed in the main body part 511 along side of the accommodation parts 518 to ensure that the camera 170 may photograph the first alignment mark disposed in the patterning slit sheet 130 and the second alignment mark disposed on the substrate 2, so that the patterning slit sheet 130 may aligned with the substrate 2.

A plurality of grinding-target parts 525 may be further disposed on a bottom surface of the main body part 511, i.e., the surface that is combined with the electrostatic chuck 530, to control planarization of the main body part 511. In more detail, planarization of the electrostatic chuck 530 and planarization of the substrate 2 that is attached to the electrostatic chuck 530 basically depend on planarization of the bottom surface of the main body part 511 of the carrier 510. Thus, planarizing the bottom surface of the main body part 511 may assure the planarization of the substrate 2. However, a conventional organic layer deposition apparatus does not separately include grinding-target parts, so that an entire bottom surface of a main body part has to be grinded. In the organic layer deposition apparatus 1 according to a present embodiment, the grinding-target parts 525 project from the bottom surface of the main body part 511, and only the grinding-target parts 525 are grinded, so that the planarization of the bottom surface of the main body part 511 may be uniform.

The deposition substrate transferring unit 500 may measure information regarding its operation and transmit the information to a control unit of the organic layer deposition apparatus 1. Thus, real-time monitoring of the deposition substrate transferring unit 500 may be performed. For example, a plurality of carrier temperature sensors 521 and a plurality of electrostatic chuck temperature sensors 522 may be placed on the carrier. The carrier temperature sensors 521 may check thermal deformation of the carrier 510 by measuring a temperature of the carrier 510. The electrostatic chuck temperature sensors 522 may check thermal deformation of the electrostatic chuck 530 by measuring a temperature of the electrostatic chuck 530. In addition, a substrate detection sensor 523 may be placed at the carrier 510 to detect whether the substrate 2 is attached to the electrostatic chuck 530. In addition, the deposition substrate transferring unit 500 may include other monitoring units such as a power measurement unit for measuring current consumption and a remaining battery power, an electrostatic chuck driving detection unit for detecting an ON/OFF state of the electrostatic chuck 530 to detect whether the substrate 2 is attached/separated, etc. In addition, information detected by the monitoring units may be transmitted to the control unit of the organic layer deposition apparatus 1 using a communication unit via short-distance wireless communication such as ZigBee or Bluetooth, to perform real-time monitoring of the deposition substrate transferring unit 500.

The electrostatic chuck 530 may include an electrode embedded in a ceramic main body. When a high voltage is supplied to the electrode, the substrate 2 attaches to a surface of the main body of the electrostatic chuck 530.

The electrostatic chuck 530 of the organic layer deposition apparatus 1 is a mother electrostatic chuck that is integrally formed into one body. In more detail, a conventional electrostatic chuck is formed by combining a plurality of divided chucks. However, in this case, a mura defect occurs at an interface between the divided chucks. Thus, to address this issue, the electrostatic chuck 530 in a present embodiment is integrally formed into one body to prevent the occurrence of a mura defect.

Furthermore, the electrostatic chuck 530 includes a plurality of lift pin holes 532 disposed in a region of the electrostatic chuck 530 which corresponds to an outer region of an active region (i.e., a pixel region) of the substrate 2. In more detail, the organic layer deposition apparatus 1 has a plurality of lift pins arranged to smoothly separate the substrate 2 from the electrostatic chuck 530 after deposition, and the electrostatic chuck 530 includes the lift pin holes 532 to accommodate the lift pins. However, since lift pin holes of a conventional electrostatic chuck are disposed in an active region (i.e., a pixel region) of a substrate, a mura defect occurs in the active. According to a present embodiment, the electrostatic chuck 530 is integrally formed in one body and has the lift pin holes 532 disposed in the region that corresponds to the outer region of the active region (i.e., the pixel region) of the substrate 2. Accordingly, a mura defect may be prevented in a region including the lift pin holes 532.

In addition, the electrostatic chuck 530 of the organic layer deposition apparatus 1 may further have an alignment mark 534 to align the electrostatic chuck 530 and the substrate 2. That is, to accurately align the electrostatic chuck 530 and the substrate 2, when the electrostatic chuck 530 is attached with the substrate 2 in the loading unit 200, a camera disposed at the loading unit 200 photographs an alignment mark disposed in the substrate 2 and the alignment mark 534 disposed in the electrostatic chuck 530, so that the electrostatic chuck 530 may be accurately aligned with the substrate 2 while the substrate 2 or electrostatic chuck 530 moves.

Hereinafter, the first conveyer unit 410 and the deposition substrate transferring unit 500 are described in detail.

Referring to FIGS. 4 and 5, the first conveyer unit 410 conveys the carrier 510 that carries the electrostatic chuck 530 that fixes the substrate. According to embodiments, the first conveyer unit 410 includes the coil 411, the guide members 412, the upper magnetically suspended bearings 413, the side magnetically suspended bearings 414, and the gap sensors 415 and 416.

The coil 411 and the guide members 412 are disposed inside the upper housing 104. The coil 411 is disposed in an upper portion of the upper housing 104, and the guide members 412 are respectively disposed on both inner sides of the upper housing 104.

The guide members 412 guide the movement of the carrier 510. In particular, the guide members 412 accommodate both sides of the carrier 510 to guide the carrier 510 to move along in the direction of arrow A illustrated in FIG. 3. According to embodiments, the guide member 412 may include a first accommodation part 412*a* disposed below the carrier 510, a second accommodation part 412*b* disposed above the carrier 510, and a connection part 412*c* that connects the first accommodation part 412*a* and the second accommodation part 412*b*. An accommodation groove 412*d* is disposed by the first accommodation part 412*a*, the second accommodation part 412*b*, and the connection part 412*c*. Both sides of the carrier 510 are respectively accommodated in the accommodation grooves 412*d*, and the carrier 510 can move along the accommodation grooves 412*d*.

The side magnetically suspended bearings 414 are each disposed in the connection part 412*c* of the guide member 412 to respectively correspond to both sides of the carrier 510. The side magnetically suspended bearings 414 separate the carrier 510 and the guide member 412 so that the carrier 510 may move along the guide members 412 without contacting the guide members 412. Recall that the carrier 510 is a magnetic material. A repulsive force R1 that occurs between the side magnetically suspended bearing 414 on a left side and the carrier 510, and a repulsive force R2 occurring between the side magnetically suspended bearing 414 on a right side and the carrier 510 maintain equilibrium, and thus a constant separation distance is maintained between the carrier 510 and the respective parts of the guide member 412.

Each upper magnetically suspended bearing 413 may be disposed in the second accommodation part 412*b* to be above the carrier 510. The upper magnetically suspended bearings 413 enable the carrier 510 to move along the guide members 412 without contacting the first and second accommodation parts 412*a* and 412*b* and while maintaining a constant separation distance therebetween. That is, a magnetic force A3 occurring between the upper magnetically suspended bearing 413 and the carrier 510 and gravity G maintain equilibrium, which maintain a constant separation distance between the carrier 510 and the respective guide members 412.

Each guide member 412 may further include the gap sensor 415. The gap sensor 415 may measure a separation distance between the carrier 510 and the guide member 412. The gap sensor 415 may be disposed in the first accommodation part 412*a* to correspond to a bottom portion of the carrier 510. The gap sensor 415 disposed in the first accommodation part 412*a* may measure a separation distance between the first accommodation part 412*a* and the carrier 510. The gap sensor 416 may be disposed at a side of the connection part 412*c*. The gap sensor 416 may measure a separation distance between a side surface of the carrier 510 and the connection part 412*c*. Embodiments of the present disclosure is not limited to the above example, and the gap sensor 416 may be disposed at a side of the side magnetically suspended bearing 414.

Magnetic forces of the upper and side magnetically suspended bearings 413 and 414 may vary according to values measured by the gap sensors 415 and 416, and thus, separation distances between the carrier 510 and the respective guide members 412 may be adjusted in real time. That is, a precise movement of the carrier 510 may be controlled using feedback from the upper and side magnetically suspended bearings 413 and 414 and the gap sensors 415 and 416.

Hereinafter, an operation of the deposition substrate transferring unit 500 is described in more detail.

The magnetic rail 512 of the main body part 511 and the coil 411 may combine with each other to constitute a linear motor. A linear motor has a small friction coefficient, little positioning error, and a very high degree of position determination, as compared to a conventional slide guide system. As described above, a linear motor may include the coil 411 and the magnetic rail 512. The magnetic rail 512 is linearly disposed on the carrier 510, and a plurality of the coils 411 may be periodically disposed at an inner side of the chamber 101, separated by a certain distance, to face the magnetic rail 512. Since the magnetic rail 512 is disposed on the carrier 510 instead of the coil 411, the carrier 510 may be operable without power being supplied thereto. The coil 411 may be disposed in an atmosphere box (ATM box) in atmospheric conditions, and the carrier 510 to which the magnetic rail 512 is attached may move in the vacuum-maintained chamber 101.

Hereinafter, the second conveyer unit 420 and the deposition substrate transferring unit 500 are described in detail. Referring back to FIG. 4, after the electrostatic chuck 530 has been separated from the substrate 2 in the unloading unit 300, the second conveyer unit 420 returns the carrier 510 that carries the electrostatic chuck 530 to the loading unit 200. According to embodiments, the second conveyer unit 420 includes the coil 421, the roller guides 422, and the charging track 423.

In more detail, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. The coil 421 may be disposed in an ATM box, as is the coil 411 of the first conveyer unit 410.

The magnetic rail 512 of the main body part 511 of the carrier 510 and the coil 421 combine with each other to constitute a linear motor. The carrier 510 may be moved by the linear motor along a direction opposite to the direction of arrow A illustrated in FIG. 3.

The roller guides 422 guide the movement of the carrier 510. In particular, the roller guides 422 support cam followers 516 (see FIG. 8) respectively disposed on both sides of the carrier 510 to guide the carrier 510 to move along a direction opposite to the direction of arrow A illustrated in FIG. 3. That is, the carrier 510 moves with the cam followers 516 respectively rotating along the roller guides 422. According to embodiments, the cam followers 516 are utilized as bearings to accurately repeat a particular operation. In an embodiment, a plurality of the cam followers 516 are disposed on side surfaces of the carrier 510 and serve as wheels for conveying the carrier 510 in the second conveyer unit 420.

The second conveyer unit 420 is used to return the carrier 510 to the loading unit 200 from the unloading unit 300, not for depositing an organic material on the substrate 2, and thus, position accuracy needed for the first conveyer unit 410 is not needed for the second conveyer unit 420. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby simplifying a structure of the organic layer deposition apparatus and reducing manufacturing costs. However, in other embodiments, magnetic suspension may also be used in the second conveyer unit 420 as in the first conveyer unit 410.

Figure 10:
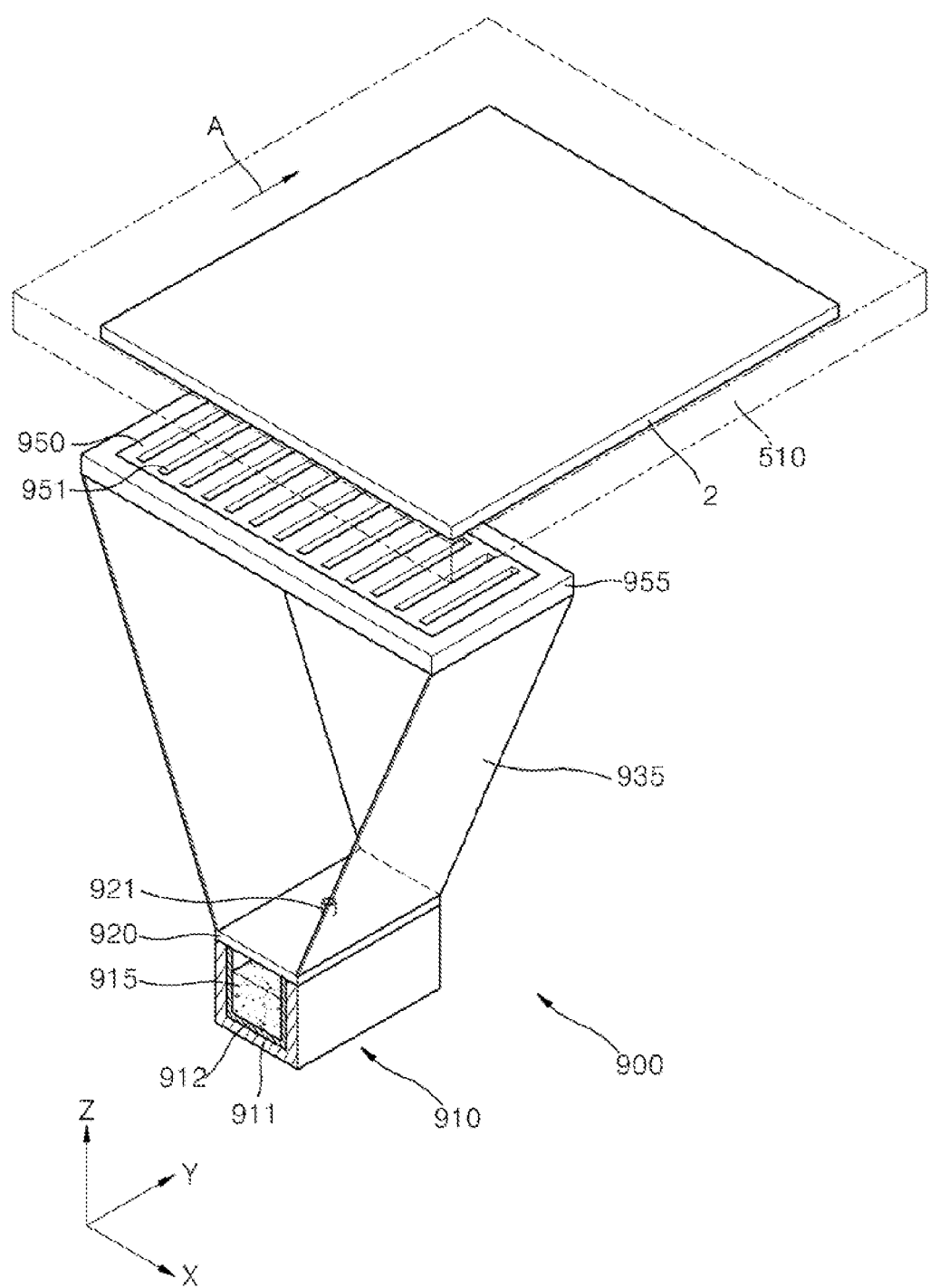
FIG. 10 is a schematic perspective view of an organic layer deposition assembly, according to another embodiment of the present disclosure.

FIG. 10 is a schematic perspective view of an organic layer deposition assembly 900, according to another embodiment of the present disclosure.

Referring to FIG. 10, the organic layer deposition assembly 900 includes a deposition source 910, a deposition source nozzle unit 920, and a patterning slit sheet 950.

The deposition source 910 includes a crucible 911 that is filled with the deposition material 915 and a heater 912 that heats the crucible 911 to vaporize the deposition material 915 in the crucible 911 to be discharged by the deposition source nozzle unit 920. The deposition source nozzle unit 920 is disposed at a side of the deposition source 910, and a plurality of deposition source nozzles 921 are disposed on the deposition source nozzle unit 920 along a Y-axis direction. In addition, the patterning slit sheet 950 and a frame 955 are further disposed between the deposition source 910 and the substrate 2, and the patterning slit sheet 950 includes a plurality of patterning slits 951 arranged in an X-axis direction. The deposition source 910, the deposition source nozzle unit 920, and the patterning slit sheet 950 are combined using connection members 935.

A present embodiment differs from previous embodiments in that the deposition source nozzle unit 920 includes an array of deposition source nozzles 921. This difference is described below.

The deposition source nozzle unit 920 is disposed at a side of the deposition source 910 to face the substrate 2. The deposition source nozzle 921 is disposed on the deposition source nozzle unit 920. The vaporized deposition material 915 in the deposition source 910 is discharged through the deposition source nozzle unit 920 toward the substrate 2 that is a deposition target. According to embodiments, if the deposition source nozzles 921 are disposed in the X-axis direction, distances between respective deposition source nozzles 921 and patterning slits 951 may differ from each other, so that shadows may occur due to deposition material being discharged from a deposition source nozzle 921 that is far from the corresponding patterning slit 951. Thus, in a present embodiment, deposition source nozzles 921 are disposed in the Y-axis direction, which may reduce the occurrence of shadows.

Figure 11:
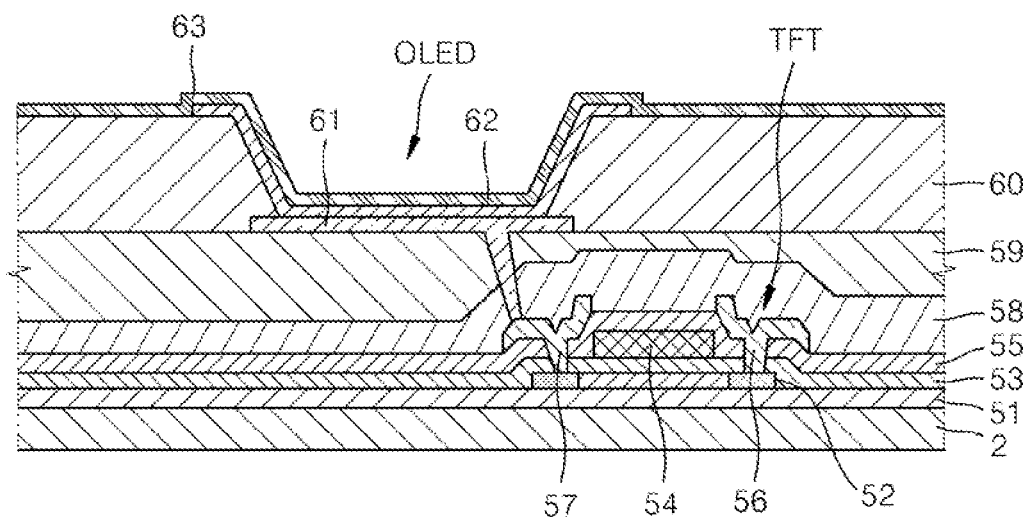
FIG. 11 is a cross-sectional view of an active matrix-type organic light-emitting display device manufactured using the organic layer deposition apparatus, according to an embodiment of the present disclosure.

FIG. 11 is a cross-sectional view of an active matrix-type organic light-emitting display device manufactured using the organic layer deposition apparatus 1, according to an embodiment of the present disclosure.

Referring to FIG. 11, the active matrix organic light-emitting display device according to a current embodiment is formed on the substrate 50. The substrate 2 may be formed of a transparent material, such as glass, plastic, or metal. An insulating layer 51, such as a buffer layer, is formed on an entire surface of the substrate 2.

A thin film transistor (TFT) and an organic light-emitting diode (OLED) are disposed on the insulating layer 51, as illustrated in FIG. 11.

A semiconductor active layer 52 is formed on an upper surface of the insulating layer 51 in a predetermined pattern. A gate insulating layer 53 is formed to cover the semiconductor active layer 52. The semiconductor active layer 52 may include a p-type or n-type semiconductor material.

A gate electrode 54 of the TFT is formed in a region of the gate insulating layer 53 corresponding to the semiconductor active layer 52. An interlayer insulating layer 55 is formed to cover the gate electrode 54. The interlayer insulating layer 55 and the gate insulating layer 53 are etched by, for example, dry etching, to form a contact hole that exposes parts of the semiconductor active layer 52.

Source/drain electrodes 56 and 57 are formed on the interlayer insulating layer 55 to contact the semiconductor active layer 52 through the contact holes. A protective layer 58 is formed to cover the source/drain electrodes 56 and 57, and is etched to expose a part of the drain electrode 57. An insulating layer 59 may be further formed on the protective layer 58 to planarize the protective layer 58.

An OLED displays predetermined image information by emitting red, green, or blue light according to an applied current. The OLED includes a first electrode 61 disposed on the protective layer 58. The first electrode 61 is electrically connected to the drain electrode 57 of the TFT.

A pixel-defining layer 60 is formed to cover the first electrode 61. An opening is formed in the pixel-defining layer 60, and an organic layer 62 that includes an emission layer (EML) is formed in a region defined by the opening. A second electrode 63 is formed on the organic layer 62.

The pixel-defining layer 60, which defines individual pixels, is formed of an organic material. The pixel-defining layer 60 also planarizes the surface of a region of the substrate 2 in which the first electrode 61 is formed, and in particular, the surface of the insulating layer 59.

The first electrode 61 and the second electrode 63 are insulated from each other, and respectively apply voltages of opposite polarities to the organic layer 62 to induce light emission.

The organic layer 62 may be formed of a low-molecular weight organic material or a high-molecular weight organic material. When a low-molecular weight organic material is used, the organic layer 62 may have a single or multi-layer structure that includes a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 62 may be formed using an organic layer deposition apparatus 1 illustrated in FIG. 1 that includes a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein. That is, an organic layer deposition apparatus is disposed spaced apart by a predetermined distance from a substrate on which the deposition material is to be deposited. In addition, the deposition material discharged from the organic layer deposition apparatus 1 is deposited on the substrate 2 while the organic layer deposition apparatus 1 moves relative to the substrate 2.

After the organic layer 62 is formed, the second electrode 63 may be formed by the same deposition method as used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may cover all the pixels.

The first electrode 61 may be formed as a transparent electrode or a reflective electrode. A transparent electrode may be formed of indium tin oxide (ITO), indium zinc oxide (IZO), zinc oxide (ZnO), or indium oxide ($In_2O_3$). A reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and then forming a layer of ITO, IZO, ZnO, or $In_2O_3$ on the reflective layer. The first electrode 61 may be formed by, for example, sputtering, and may be patterned by, for example, photolithography.

The second electrode 63 may also be formed as a transparent electrode or a reflective electrode. If the second electrode 63 is formed as a transparent electrode, the second electrode 63 is used as a cathode. To this end, a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from ITO, IZO, ZnO, $In_2O_3$, etc. If the second electrode 63 is formed as a reflective electrode, the reflective layer may be formed by depositing Li, Ca, LiF/Ca, LiF/Al, Al, Ag, Mg, or a compound thereof on the entire surface of the organic layer 62. The second electrode 63 may be formed using the same deposition method as used to form the organic layer 62 described above.

Organic layer deposition apparatuses according to embodiments of the present disclosure described above may be applied to form an organic layer or an inorganic layer of an organic TFT, and to form layers from various materials.

Exemplary embodiments of the present disclosure may embody a deposition substrate transferring unit which allows a deposition material to be deposited at an exact location on the substrate, an organic layer deposition apparatus including the deposition substrate transfer unit, and a method of manufacturing an organic light-emitting display device using the substrate transfer unit. However, the spirit and scope of the present disclosure are not limited by the exemplary embodiments.

While embodiments of the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A method of manufacturing an organic light-emitting display device, the method comprising:
   conveying, into a chamber, a deposition substrate transferring unit using a first conveyer unit that passes through the chamber while a substrate is fixed on a surface of an electrostatic chuck that is combined with a carrier of the deposition substrate transferring unit;
   forming a layer on the substrate by depositing a deposition material discharged from an organic layer deposition assembly while simultaneously moving the substrate relative to the organic layer deposition assembly using the first conveyer unit, wherein the organic layer deposition assembly in the chamber is spaced apart from the substrate by a predetermined distance;

separating the substrate from the deposition substrate transferring unit; and conveying the deposition substrate transferring unit from which the substrate is separated using a second conveyer unit that passes through the chamber, wherein the carrier comprises accommodation parts that comprise empty spaces within the carrier, and supplementary ribs disposed on surfaces of the accommodation parts, respectively.

2. The method of claim 1, wherein the supplementary ribs are disposed on inner sides of the surface of the carrier.

3. The method of claim 2, wherein each of the supplementary ribs has an X-shape.

4. The method of claim 1, further comprising grinding-target parts that project from a surface of the carrier and disposed to extend in the first direction on the surface of the carrier.

5. The method of claim 4, wherein the grinding-target parts project from the surface of the carrier that is combined with the electrostatic chuck, and are ground to a predetermined level.

6. The method of claim 1, further comprising measuring information about at least one of thermal deformation of the carrier, thermal deformation of the electrostatic chuck, whether the substrate is attached to the electrostatic chuck, current consumption of the deposition substrate transferring unit or a remaining power of a battery, and an ON or OFF state of the electrostatic chuck.

7. The method of claim 6, wherein the information is transmitted to a control unit of the organic layer deposition assembly via short-distance wireless communication.

8. The method of claim 1, wherein the electrostatic chuck comprises lift pin holes disposed in a region that corresponds to an outer region of a pixel region of the substrate.

9. The method of claim 1, wherein the electrostatic chuck further comprises an alignment mark disposed thereon that is configured to align the electrostatic chuck and the substrate.

10. The method of claim 1, wherein the carrier further comprises a magnetic rail placed on a surface thereof, each of the first conveyer unit and the second conveyer unit comprises a plurality of coils, wherein the magnetic rail and the plurality of coils combine to constitute a linear motor configured to generate a driving force to move the deposition substrate transferring unit.

11. The method of claim 10, wherein the first conveyer unit comprises accommodation grooves disposed on both sides of the deposition substrate transferring unit and which are configured to guide the deposition substrate transferring unit to move in the first direction; and a plurality of magnetically suspended bearings that are configured to suspend the deposition substrate transferring unit from the accommodation grooves, wherein the deposition substrate transferring unit moves along the first conveyer unit without contacting the accommodation grooves.

12. The method of claim 11, wherein the magnetically suspended bearings comprise side magnetically suspended bearings disposed on both side surfaces of the carrier and upper magnetically suspended bearings disposed above the carrier.

13. The method of claim 1, wherein:

the carrier further comprises a plurality of cam followers disposed on both side surfaces thereof, and the second conveyer unit further comprises a roller guide configured to support the plurality of cam followers, wherein the cam followers are configured to move the carrier along the roller guide.

14. The method of claim 1, wherein the carrier further comprises a contactless power supply (CPS) module, and the second conveyer unit further comprises a charging track disposed in a portion thereof which corresponds to the CPS module, wherein when the carrier is transferred into the second conveyer unit, a magnetic field forms between the charging track and the CPS module that supplies power to the CPS module, wherein the CPS module does not contact the charging track.

15. The method of claim 1, wherein the organic layer deposition assembly comprises a patterning slit sheet that is smaller than the substrate in at least one of the first direction and the second direction.

* * * * *